US012690135B2

(12) United States Patent
Wingfield et al.

(10) Patent No.: US 12,690,135 B2
(45) Date of Patent: Jul. 21, 2026

(54) SYSTEMS AND METHODS FOR ADDING ERGONOMIC HANDLING ASSEMBLY TO AN INFORMATION HANDLING RESOURCE MODULE

(71) Applicant: Dell Products L.P., Round Rock, TX (US)

(72) Inventors: Megan Cherie Wingfield, Dalzell, SC (US); Eduardo Escamilla, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 109 days.

(21) Appl. No.: 18/935,778

(22) Filed: Nov. 4, 2024

(65) Prior Publication Data

US 2026/0129761 A1     May 7, 2026

(51) Int. Cl.
H05K 1/181 (2026.01)
G06F 1/185 (2026.01)

(52) U.S. Cl.
CPC ............. H05K 1/181 (2013.01); G06F 1/185 (2013.01); *H05K 2201/10159* (2013.01); *H05K 2201/1034* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,276,950 B1 * | 8/2001 | Yodogawa | ......... | H01R 12/7005 439/160 |
| 6,702,598 B1 * | 3/2004 | Lo | ....................... | H01R 12/7005 439/328 |
| 6,816,388 B2 * | 11/2004 | Junkins | ................ | H05K 7/1418 361/801 |
| 7,283,371 B1 * | 10/2007 | Grouell | ................... | G06F 1/185 361/801 |
| 7,510,416 B2 * | 3/2009 | Sato | ..................... | H05K 7/1409 439/159 |
| 7,535,730 B2 * | 5/2009 | Junkins | ................ | H05K 7/1418 361/801 |
| 7,746,665 B2 * | 6/2010 | Junkins | ................ | H05K 7/1429 361/801 |
| 8,087,950 B1 * | 1/2012 | Deng | ................... | H01R 12/737 439/328 |
| 8,385,080 B2 * | 2/2013 | Kim | ......................... | H05K 7/00 439/157 |
| 8,873,240 B2 * | 10/2014 | Jimenez, III | ........... | G06F 1/185 361/730 |
| 9,063,705 B2 * | 6/2015 | Howell | ................ | H05K 7/1409 |
| 9,370,118 B2 * | 6/2016 | Li | ......................... | H05K 7/1409 |

(Continued)

*Primary Examiner* — Lisa Lea-Edmonds
(74) *Attorney, Agent, or Firm* — Jackson Walker L.L.P.

(57) ABSTRACT

An information handling system may include an information handling resource comprising a circuit board and an ergonomic assembly mechanically coupled to the information handling resource. The ergonomic assembly may include a main body mechanically attached to the circuit board via a press-fit mechanical coupling to a top edge of the circuit board and a latch mechanically coupled to the main body and having a first mechanical feature configured to mechanically engage with a second mechanical feature of the main body in order to secure mechanical coupling of the ergonomic assembly to the information handling resource.

17 Claims, 7 Drawing Sheets

(56) References Cited

U.S. PATENT DOCUMENTS

| | | | | |
|---|---|---|---|---|
| 9,735,485 | B2 * | 8/2017 | Schulze | H01R 12/721 |
| 9,763,351 | B1 * | 9/2017 | Ulrich | G06F 1/186 |
| 10,206,302 | B2 * | 2/2019 | Liao | G06F 1/183 |
| 10,553,974 | B2 * | 2/2020 | Li | H01R 12/7005 |
| 10,645,835 | B1 * | 5/2020 | Sauer | H05K 7/1461 |
| 10,739,831 | B2 * | 8/2020 | Shabbir | G06F 1/20 |
| 11,460,895 | B2 * | 10/2022 | Hobbs | H05K 7/2039 |
| 11,789,877 | B2 * | 10/2023 | Schnell | G06F 13/16 |
| | | | | 710/305 |
| 2009/0154123 | A1 * | 6/2009 | Junkins | H05K 7/1429 |
| | | | | 361/801 |
| 2013/0135813 | A1 * | 5/2013 | Jimenez, III | G06F 1/185 |
| | | | | 248/220.21 |
| 2015/0131227 | A1 * | 5/2015 | Howell | G06F 1/185 |
| | | | | 211/26 |
| 2019/0103690 | A1 * | 4/2019 | Li | H01R 12/7005 |
| 2022/0083108 | A1 * | 3/2022 | Hobbs | H05K 7/2039 |
| 2022/0336981 | A1 * | 10/2022 | Wang | H01R 27/02 |
| 2025/0053529 | A1 * | 2/2025 | Escamilla | G06F 13/36 |
| 2025/0203777 | A1 * | 6/2025 | McKittrick | H05K 1/111 |
| 2026/0066561 | A1 * | 3/2026 | Wingfield | G06F 1/185 |

* cited by examiner

SYSTEMS AND METHODS FOR ADDING ERGONOMIC HANDLING ASSEMBLY TO AN INFORMATION HANDLING RESOURCE MODULE

TECHNICAL FIELD

The present disclosure relates in general to information handling systems, and more particularly to adding an ergonomic handling assembly to an information handling resource module in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may often use one or more circuit boards. A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

A type of circuit board often used in information handling systems is memory modules, such as dual-inline memory modules (DIMMs). DIMMs typically comprise a circuit board with a plurality of memory chips mounted thereon.

Edges of DIMMs and other circuit boards may be very thin, which may render it difficult for a person to ergonomically install DIMMs and other circuit boards into an information handling system, such as installing a DIMM or other circuit board having an edge connector into a receptacle connector mounted to a motherboard. Pushing downward on a DIMM or other circuit board may be uncomfortable for a person, and it may be difficult for a person to apply force evenly through the top surface. Further, DIMMs and other circuit boards may sometimes include components close to the top edge, leaving such components susceptible to damage should a person's finger slide off of or deform over the top edge.

SUMMARY

In accordance with the teachings of the present disclosure, the disadvantages and problems associated with inserting an information handling resource into an information handling system may be reduced or eliminated.

In accordance with embodiments of the present disclosure, an information handling system may include an information handling resource comprising a circuit board and an ergonomic assembly mechanically coupled to the information handling resource. The ergonomic assembly may include a main body mechanically attached to the circuit board via a press-fit mechanical coupling to a top edge of the circuit board and a latch mechanically coupled to the main body and having a first mechanical feature configured to mechanically engage with a second mechanical feature of the main body in order to secure mechanical coupling of the ergonomic assembly to the information handling resource.

In accordance with these and other embodiments of the present disclosure, an ergonomic assembly configured to mechanically couple to a circuit board of an information handling resource may include a main body configured to mechanically attach to the circuit board via a press-fit mechanical coupling to a top edge of the circuit board and a latch mechanically coupled to the main body and having a first mechanical feature configured to mechanically engage with a second mechanical feature of the main body in order to secure mechanical coupling of the ergonomic assembly to the information handling resource.

In accordance with these and other embodiments of the present disclosure a method for constructing an ergonomic assembly configured to mechanically couple to a circuit board of an information handling resource may include configuring a main body of the ergonomic assembly to mechanically attach to the circuit board via a press-fit mechanical coupling to a top edge of the circuit board and mechanically coupling a latch to the main body, the latch having a first mechanical feature configured to mechanically engage with a second mechanical feature of the main body in order to secure mechanical coupling of the ergonomic assembly to the information handling resource.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
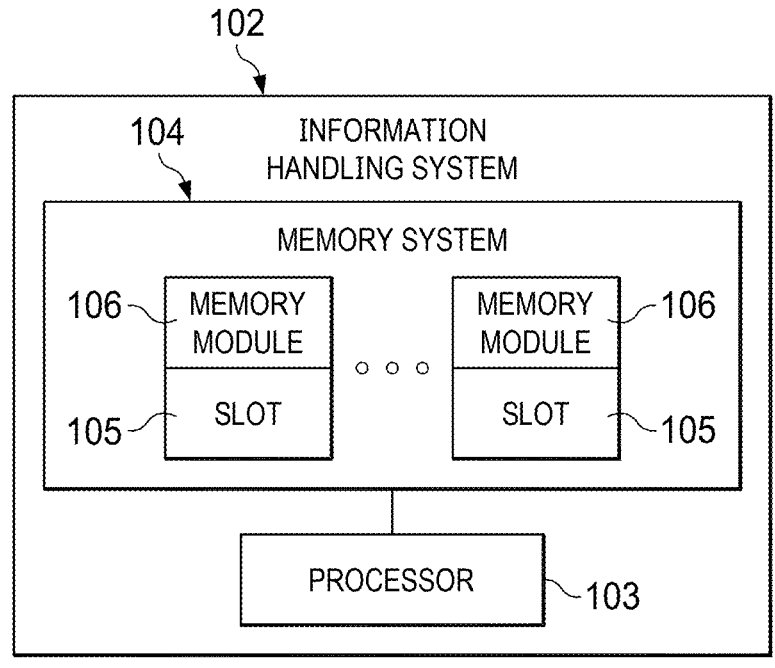
FIG. 1 illustrates a block diagram of an example information handling system, in accordance with embodiments of the present disclosure.

FIG. 1 illustrates a block diagram of selected components of an example information handling system 102, in accordance with embodiments of the present disclosure. In some embodiments, information handling system 102 may be a personal computer. In some embodiments, information handling system 102 may comprise or be an integral part of a server. In other embodiments, information handling system 102 may be a portable information handling system (e.g., a laptop, notebook, tablet, handheld, smart phone, personal digital assistant, etc.). As depicted in FIG. 1, information handling system 102 may include a processor 103 and a memory system 104 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory system 104 and/or another component of information handling system 102.

Memory system 104 may be communicatively coupled to processor 103 and may include any system, device, or apparatus configured to retain program instructions and/or data for a period of time (e.g., computer-readable media). Memory system 104 may include RAM, EEPROM, a PCM-CIA card, flash memory, magnetic storage, opto-magnetic storage, or any suitable selection and/or array of volatile or non-volatile memory that retains data after power to information handling system 102 is turned off.

As shown in FIG. 1, memory system 104 may comprise a plurality of memory slots 105, each configured to receive a corresponding memory module 106. A memory slot 105 may include any system, device, or apparatus configured to receive a memory module 106 in order to electrically couple such memory module 106 to processor 103. Each memory module 106 may include any system, device or apparatus configured to retain program instructions and/or data for a period of time (e.g., computer-readable media). Each memory module 106 may include a dynamic random access memory (DRAM) module (e.g, a Dual In-line Package (DIP) memory, a Single In-line Pin Package (SIPP) memory, a Single In-line Memory Module (SIMM), a Dual In-line Memory Module (DIMM), a Ball Grid Array (BGA)), or any other suitable memory.

To insert a memory module 106 into a memory slot 105, a person may need to apply force along an edge of the memory module and in a direction perpendicular to a surface of the circuit board implementing the memory module 106, in order to cause an edge connector of the memory module 106 to electrically and mechanically couple to the memory slot 105, which may be implemented as a receptacle connector.

In addition to processor 103 and memory system 104, information handling system 102 may include one or more other information handling resources.

Figure 2A:
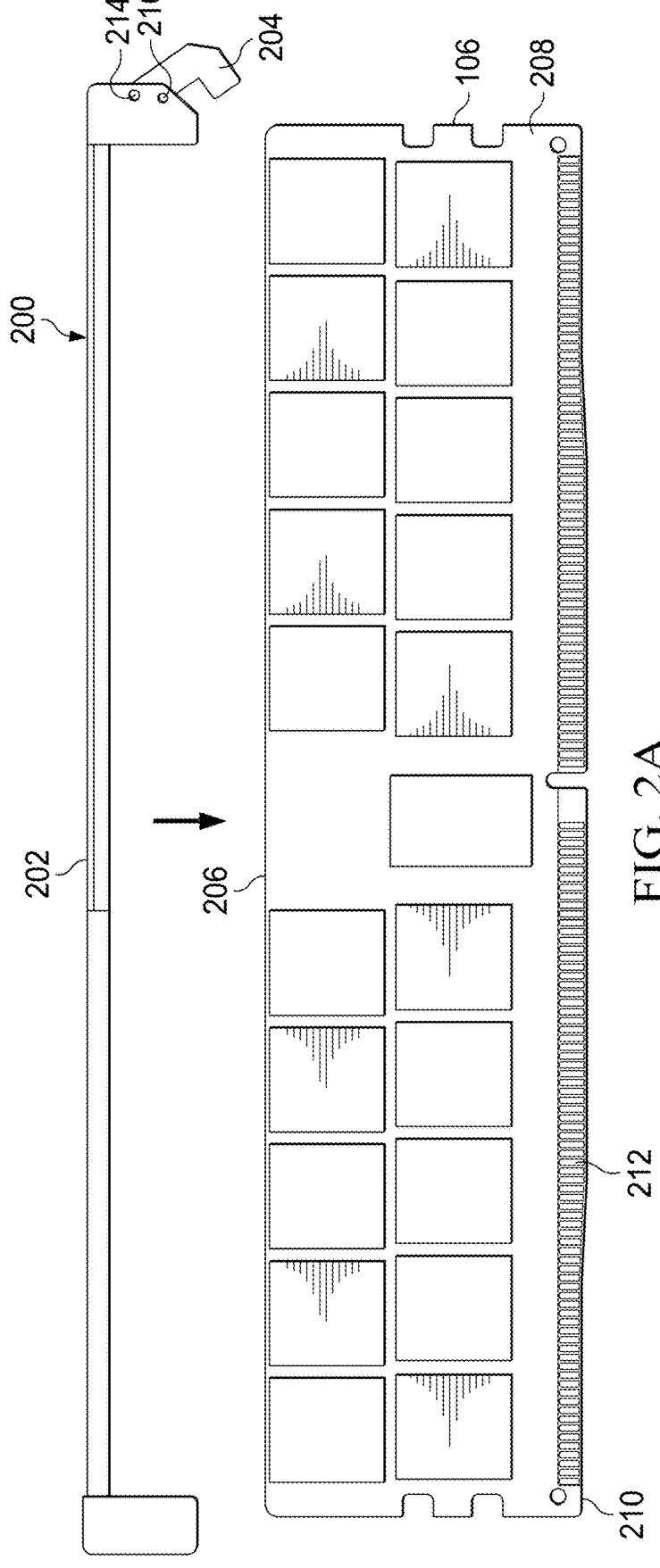
FIG. 2A illustrates a side elevation view of a memory module and an ergonomic assembly prior to mechanical attachment of the ergonomic assembly to the memory module, in accordance with embodiments of the present disclosure.
Figure 2B:
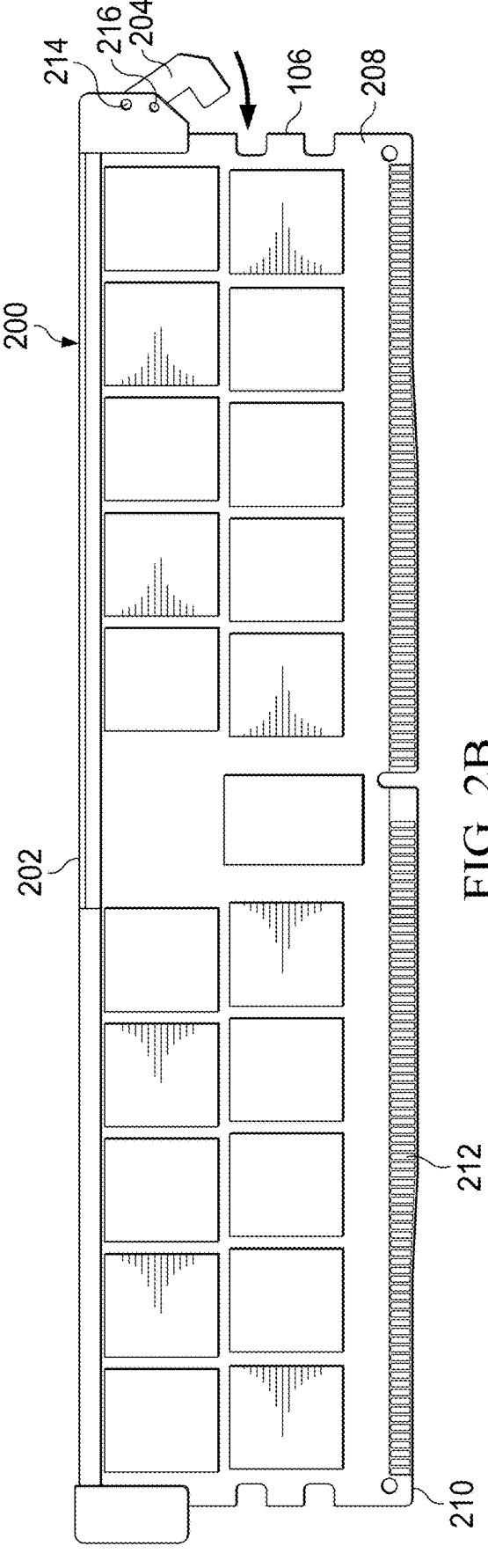
FIG. 2B illustrates a side elevation view of an ergonomic assembly mechanically attached to a memory module with a latch of the ergonomic assembly in an open position, in accordance with embodiments of the present disclosure.
Figure 2C:
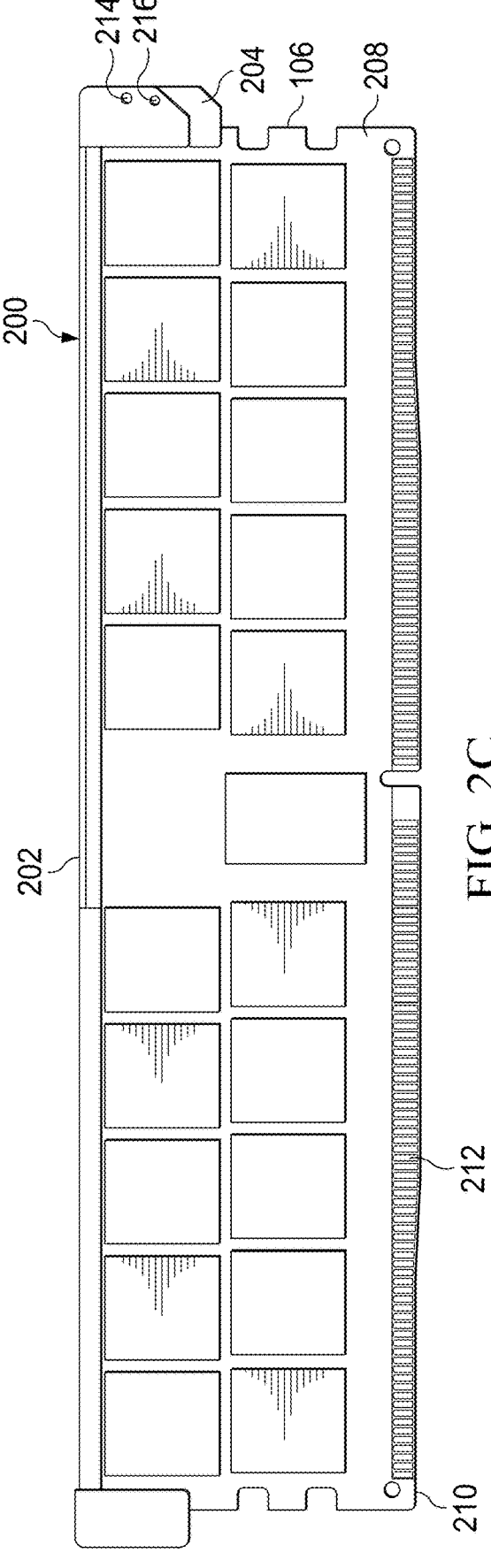
FIG. 2C illustrates a side elevation of an ergonomic assembly mechanically attached to a memory module with a latch of the ergonomic assembly in a closed position, in accordance with embodiments of the present disclosure.

FIG. 2A illustrates a side elevation view of a memory module 106 and an ergonomic assembly 200 prior to mechanical attachment of ergonomic assembly 200 to memory module 106, in accordance with embodiments of the present disclosure. FIG. 2B illustrates a side elevation view of ergonomic assembly 200 mechanically attached to memory module 106 with a latch 204 of ergonomic assembly 200 in an open position, in accordance with embodiments of the present disclosure. FIG. 2C illustrates a side elevation of ergonomic assembly 200 mechanically attached to memory module 106 with latch 204 of ergonomic assembly 200 in a closed position, in accordance with embodiments of the present disclosure.

Figure 3A:
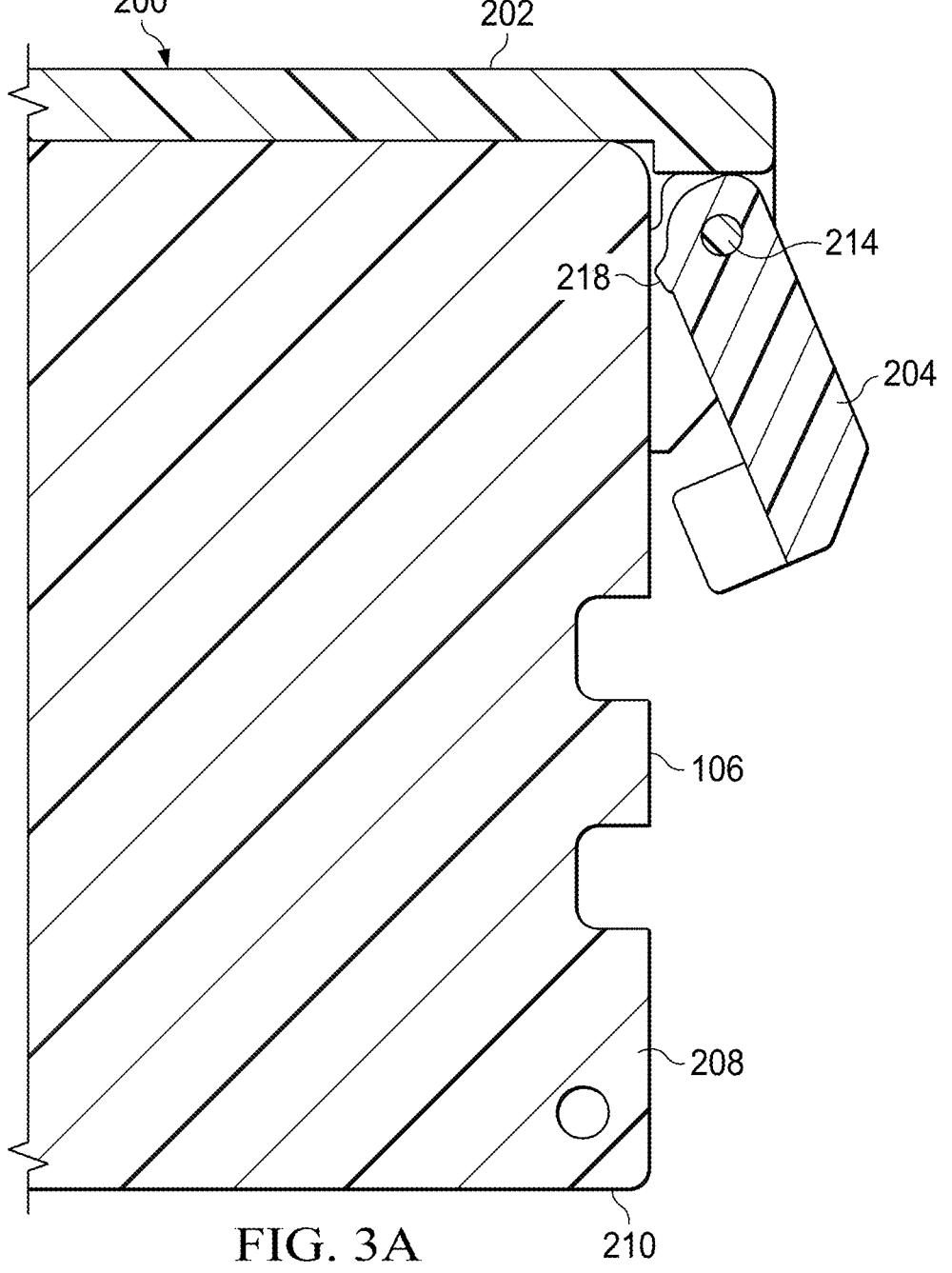
FIG. 3A illustrates a close-up side elevation view of an ergonomic assembly mechanically attached to a memory module with a latch of the ergonomic assembly in an open position, in accordance with embodiments of the present disclosure.
Figure 3B:
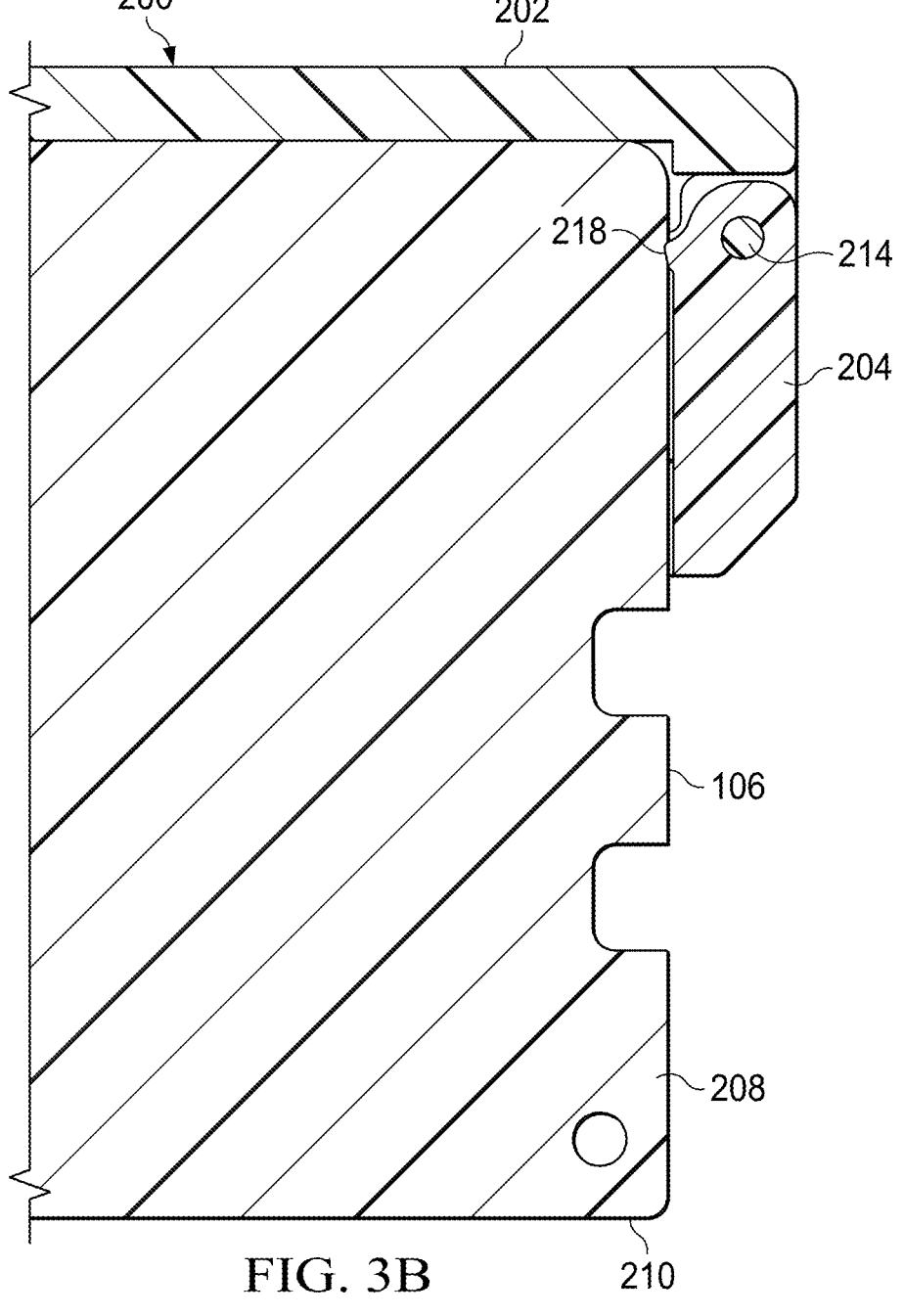
FIG. 3B illustrates a close-up side elevation of an ergonomic assembly mechanically attached to a memory module with a latch of the ergonomic assembly in a closed position, in accordance with embodiments of the present disclosure.

FIG. 3A illustrates a close-up side elevation view of ergonomic assembly 200 mechanically attached to memory module 106 with latch 204 of ergonomic assembly 200 in an open position, in accordance with embodiments of the present disclosure. In essence, FIG. 3A is a "zoomed in" depiction of a portion of FIG. 2B. FIG. 3B illustrates a close-up side elevation of ergonomic assembly 200 mechanically attached to memory module 106 with latch 204 of ergonomic assembly 200 in a closed position, in accordance with embodiments of the present disclosure.

As shown in FIGS. 2A-2C and 3A-3B, ergonomical assembly 200 may comprise a main body 202 and latch 204 mechanically coupled to main body 202. In some embodiments, latch 204 may be rotatably coupled to main body 202 via an axis 214.

Main body 202 may be constructed from plastic and may be configured (e.g., sized and shaped) to press-fit onto a top edge 206 of a circuit board 208 used to implement memory module 106, wherein top edge 206 is opposite of a bottom edge 210 having an edge connector 212 configured to couple to a slot 105. In some embodiments, main body 202 may be configured similar in size and/or shape to a receptacle connector used to implement a slot 105.

To mechanically attach ergonomic assembly 200 to memory module 106, a person may lower main body 202 onto top edge 206 such that mechanical engagement features of main body 202 mechanically engage with top edge 206, as shown in FIG. 2A. Further, once the mechanical engagement features of main body 202 have mechanically engaged with top edge 206, the person may apply force to latch 204 to mechanically translate latch 204 from its open position, as shown in FIGS. 2B and 3A, to its closed position, as shown in FIGS. 2C and 3B. As shown in FIGS. 2A-2C, a portion of main body 202 proximate to latch 204 may include a detent 216 or other feature formed therein, such that when latch 204 is in its closed position, a mechanical feature (not shown) of latch 204 may mechanically engage with detent 216 to maintain latch 204 in its closed position.

As shown in FIGS. 3A and 3B, latch 204 may also include a mechanical interference feature 218 configured such that when latch 204 is in its closed position, mechanical interference feature 218 presses against a side edge of memory module 106, applying force to the side edge that mechanically "squeezes" memory module 106 between mechanical interference feature 218 and a side of main body 202 opposite of mechanical interference feature 218 to further maintain mechanical attachment of ergonomic assembly 200 to memory module 106.

To remove ergonomic assembly 200 from memory module 106, a person may apply force to latch 204 to overcome the mechanical engagement of latch 204 to detent 216, then apply a force to ergonomic assembly 200 to mechanically disengage ergonomic assembly 200 from memory module 106.

With ergonomic assembly 200 mechanically attached to memory module 106, ergonomic assembly 200 may provide larger surfaces proximate to the top and sides of memory module 106, thus providing a person a larger surface area for mechanically manipulating a memory module 106 into a slot 105 or from a slot 105.

Figure 4:
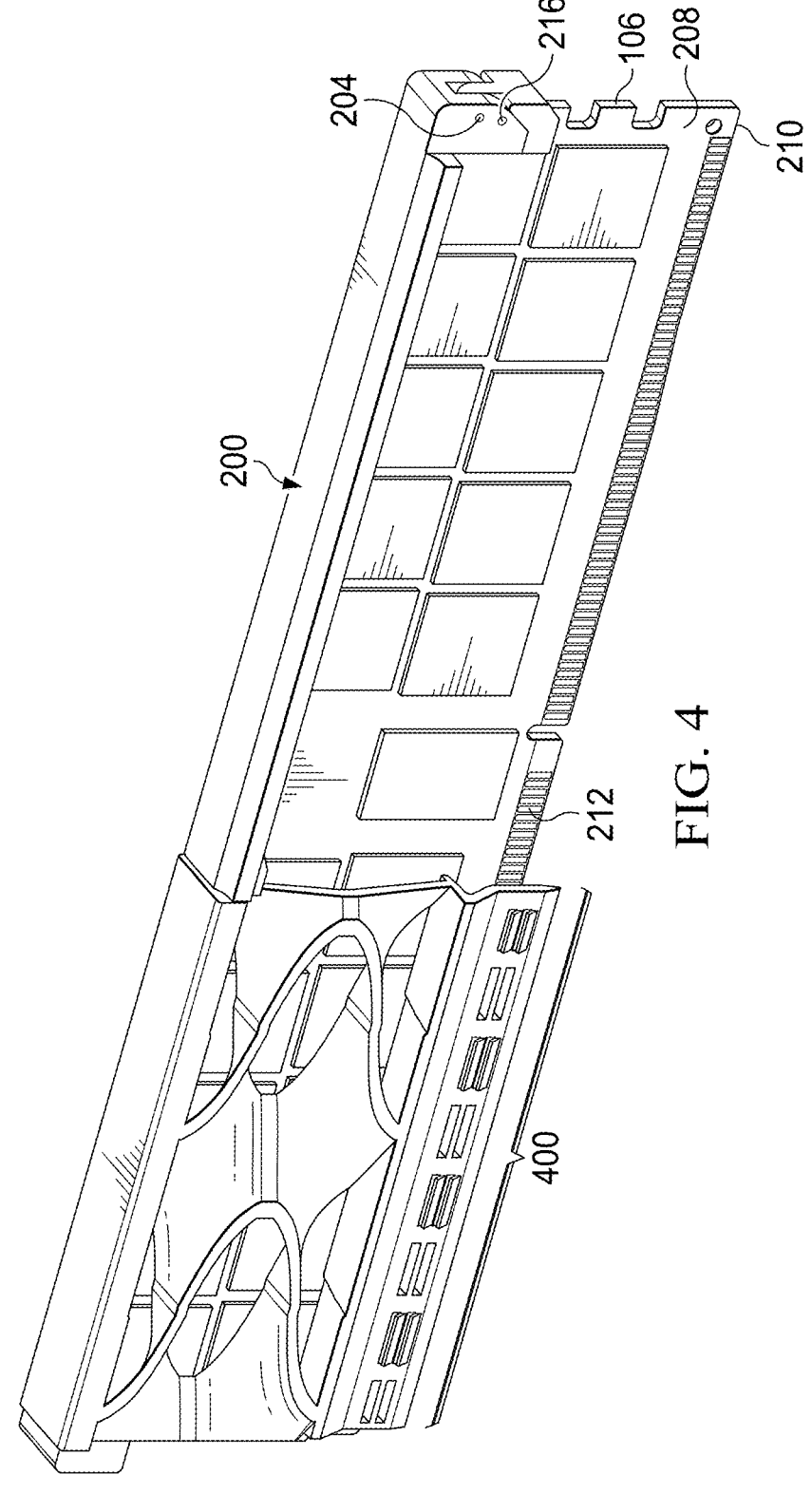
FIG. 4 illustrates an isometric perspective view of an ergonomic assembly mechanically attached to a memory module with a latch of the ergonomic assembly in a closed position and a thermal insert assembly mechanically attached to the ergonomic assembly, in accordance with embodiments of the present disclosure.

Further, in some embodiments, ergonomic assembly 200 may provide another approach to mechanically coupling thermal inserts and/or other inserts to memory module 106. For example, FIG. 4 illustrates an isometric perspective view of ergonomic assembly 200 mechanically attached to memory module 106 with latch 204 of ergonomic assembly 200 in its closed position and a thermal insert assembly 400 mechanically attached to ergonomic assembly 200, in accordance with embodiments of the present disclosure. Thermal insert assembly 400 may include any mechanical member of any suitable geometry, including a "swirling" or "helical" geometry such as that shown in FIG. 4 that may cause air flowing through thermal insert assembly 400 to move in a desired way, particularly when thermal insert assembly 400 is proximate to one or two memory modules 106. An example of thermal insert assembly 400 is described in U.S. patent application Ser. No. 18/816,935, filed Aug. 27, 2024, and incorporated by reference herein in its entirety.

Although the foregoing describes mounting a mechanical accessory (e.g., ergonomic assembly 200) configured to mechanically couple to memory modules 106 in an information handling system, it is understood that the methods and systems described herein may be applied for mounting such mechanical accessory to any suitable information handling resource other than a memory module.

While the terms "top" and "bottom" are used for purposes of exposition and clarity, such terms are not intended to limit any of the mounts disclosed herein to a particular orientation or configuration.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
an information handling resource comprising a circuit board; and
an ergonomic assembly mechanically coupled to the information handling resource and comprising:
a main body mechanically attached to the circuit board via a press-fit mechanical coupling to a top edge of the circuit board; and
a latch mechanically coupled to the main body and having a first mechanical feature configured to mechanically engage with a second mechanical feature of the main body in order to secure mechanical coupling of the ergonomic assembly to the information handling resource.

2. The information handling system of claim 1, wherein the second mechanical feature comprises a detent formed within the main body.

3. The information handling system of claim 1, wherein the first mechanical feature is an interference feature and the second mechanical feature is a side edge of the circuit board.

4. The information handling system of claim 1, wherein the latch is rotatably coupled to the main body via an axis.

5. The information handling system of claim 1, wherein the information handling resource comprises a memory module.

6. The information handling system of claim 1, further comprising a thermal insert assembly mechanically coupled to the information handling resource via the ergonomic assembly.

7. An ergonomic assembly configured to mechanically couple to a circuit board of an information handling resource, the ergonomic assembly comprising:
a main body configured to mechanically attach to the circuit board via a press-fit mechanical coupling to a top edge of the circuit board; and
a latch mechanically coupled to the main body and having a first mechanical feature configured to mechanically engage with a second mechanical feature of the main body in order to secure mechanical coupling of the ergonomic assembly to the information handling resource.

8. The ergonomic assembly of claim 7, wherein the second mechanical feature comprises a detent formed within the main body.

9. The ergonomic assembly of claim 7, wherein the first mechanical feature is an interference feature and the second mechanical feature is a side edge of the circuit board.

10. The ergonomic assembly of claim 7, wherein the latch is rotatably coupled to the main body via an axis.

11. The ergonomic assembly of claim 7, wherein the information handling resource comprises a memory module.

12. A method for constructing an ergonomic assembly configured to mechanically couple to a circuit board of an information handling resource, the method comprising:
configuring a main body of the ergonomic assembly to mechanically attach to the circuit board via a press-fit mechanical coupling to a top edge of the circuit board; and
mechanically coupling a latch to the main body, the latch having a first mechanical feature configured to mechanically engage with a second mechanical feature of the main body in order to secure mechanical coupling of the ergonomic assembly to the information handling resource.

13. The method of claim 12, wherein the second mechanical feature comprises a detent formed within the main body.

14. The method of claim 12, wherein the first mechanical feature is an interference feature and the second mechanical feature is a side edge of the circuit board.

15. The method of claim 12, further comprising rotatably coupling the latch to the main body via an axis.

16. The method of claim 12, wherein the information handling resource comprises a memory module.

17. The method of claim 12, further comprising mechanically coupling a thermal insert assembly to the information handling resource via the ergonomic assembly.

* * * * *